(12) United States Patent
Kononchuk et al.

(10) Patent No.: US 7,452,785 B2
(45) Date of Patent: Nov. 18, 2008

(54) METHOD OF FABRICATION OF HIGHLY HEAT DISSIPATIVE SUBSTRATES

(75) Inventors: Oleg Kononchuk, Grenoble (FR); Fabrice Letertre, Meylan (FR); Robert Langer, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/774,201

(22) Filed: Jul. 6, 2007

(65) Prior Publication Data

US 2008/0194084 A1    Aug. 14, 2008

Related U.S. Application Data

(63) Continuation of application No. PCT/IB2007/000950, filed on Feb. 8, 2007.

(51) Int. Cl.
   *H01L 21/00*    (2006.01)

(52) U.S. Cl. .................. 438/455; 438/406; 438/407; 438/458; 438/479; 438/542; 257/E21.122; 257/E21.152; 257/E21.219; 257/E21.568

(58) Field of Classification Search ................ 438/406, 438/407, 455, 458, 479, 542; 257/E21.122, 257/E21.152, E21.219, E21.568
   See application file for complete search history.

(56) References Cited

U.S. PATENT DOCUMENTS

| 6,120,597 | A  | * | 9/2000 | Levy et al. | 117/3 |
| 6,328,796 | B1 | * | 12/2001 | Kub et al. | 117/94 |
| 6,974,759 | B2 | * | 12/2005 | Moriceau et al. | 438/459 |
| 7,008,859 | B2 | * | 3/2006 | Letertre et al. | 438/459 |
| 2003/0064735 | A1 | | 4/2003 | Spain et al. | 455/456 |

(Continued)

FOREIGN PATENT DOCUMENTS

EP    1 653 504 A1    5/2006

(Continued)

OTHER PUBLICATIONS

Jean-Pierre Colinge, "Silicon-On-Insulator Technology: Materials to VLSI", 2nd Edition, pp. 50-51.

(Continued)

*Primary Examiner*—Michael S Lebentritt
(74) *Attorney, Agent, or Firm*—Winston & Strawn LLP

(57) ABSTRACT

The invention relates to a method for fabricating a composite structure having heat dissipation properties greater than a bulk single crystal silicon structure having the same dimensions. The structure includes a support substrate, a top layer and an oxide layer between the support substrate and the top layer. The method includes providing a top layer made of a crystalline material, providing a support substrate of a polycrystalline material having heat dissipation properties greater than that of a bulk single crystal silicon substrate of the same dimensions; providing an oxide layer on at least one of the top layer or the support substrate; bonding the top layer and support substrate together to obtain a composite structure having the top layer, the support substrate and the oxide layer located at a bonding interface between the top layer and support substrate, and heat treating the composite structure in a non-oxidizing atmosphere at a predetermined temperature and for a predetermined duration to dissolve at least part of the oxide layer and increase the heat dissipation properties of the composite structure compared to the composite structure prior to the heat treating.

18 Claims, 2 Drawing Sheets

U.S. PATENT DOCUMENTS

| | | | |
|---|---|---|---|
| 2004/0187766 A1 | 9/2004 | Letertre | 117/11 |
| 2005/0118789 A1 | 6/2005 | Aga et al. | 438/459 |
| 2006/0051945 A1 | 3/2006 | Yokokawa et al. | 438/526 |
| 2006/0091400 A1 | 5/2006 | Faure et al. | 257/76 |
| 2006/0154442 A1 | 7/2006 | De Souza et al. | 438/455 |
| 2007/0080372 A1 | 4/2007 | Faure et al. | 257/201 |

FOREIGN PATENT DOCUMENTS

| | | |
|---|---|---|
| FR | 2 852 974 A1 | 10/2004 |
| JP | 2000-036445 | 2/2000 |
| JP | 2006-049725 | 2/2006 |
| WO | WO 2006/138422 A1 | 12/2006 |

OTHER PUBLICATIONS

Q.-Y. Tong et al., "Semiconductor Wafer Bonding Science and Technology", Wiley Interscience publication, Johnson Wiley & Sons, Inc., pp. 1-99.

International Search Report, application No. PCT/IB2007/000950, dated Jan. 30, 2008.

A. Misiuk et al., "Effect Of High Temperature—Pressure On SOI Structure", Crystal Engineering, vol. 5, pp. 155-161 (2002).

K.-Y. Ahn et al., "Stability Of Interfacial Oxide Layers During Silicon Wafer Bonding", Journal of Appl. Phys., vol. 65, No. 2, pp. 561-563 (1989).

Oleg Kononchuk et al., "Internal Dissolution of Buried Oxide in SOI Wafers", Solid State Phenomena, vol. 131-133, pp. 113-118 (2008).

Jim Sullivan et al., "High Temperature Oxygen Out-Diffusion from the Interfacial SiOx Bond Layer in Direct Silicon Bonded (DSB) Substrates", IEEE 2006 International SOI Conference.

\* cited by examiner

METHOD OF FABRICATION OF HIGHLY HEAT DISSIPATIVE SUBSTRATES

CROSS-REFERENCE TO RELATED APPLICATIONS

This application is a continuation of International application PCT/IB2007/000950 filed Feb. 8, 2007, the entire content of which is expressly incorporated herein by reference thereto.

BACKGROUND

The invention relates to a method for fabricating composite structures having high heat dissipation properties, dedicated to be substrates for the crystal growth of single-crystal layers aimed to receive electronic devices or components or, substrates including such single-crystal layers.

These structures may especially be useful for dissipating the heat generated by the components during operation. They are particularly useful when the components generate a lot of thermal energy, as for high power frequency components (typically more than 900 MHz). Indeed, if the temperature of the single-crystal layer is greater than a threshold temperature, the components could be disturbed or even damaged.

To overcome this drawback, the single-crystal layers are typically made of a nitride semiconductor material having better charge carrying properties (high saturation rate of carriers at high voltages, high breakdown voltages, etc.) than materials such as AsGa. This is particularly true for HEMT (High Electron Mobility Transistor) type components.

To form this type of nitride semiconductor layers, growth substrates made of single-crystal bulk SiC, bulk <111> silicon or bulk sapphire ($Al_2O_3$) are used. However, thermal impedances of <111> Si and sapphire are too high for some high power frequency applications that require greater dissipation of released heat. Thus the components could still be disturbed or damaged. And single-crystal bulk SiC is a costly material, although it is a reference material in terms of heat dissipation.

Thus there is a need for substrates which sufficiently dissipate thermal energy at relatively low cost. For this goal, U.S. Pat. No. 6,328,796 and US published patent application 2003/0064735 disclose the manufacturing of composite structures using a wafer bonding technique comprising the following steps:

providing a substrate and a wafer with a top single-crystal layer thereon, forming a bonding oxide layer on the substrate and/or on the top layer;

bonding the substrate and the wafer such that the oxide layer and the top layer are at the bonding interface, reducing the wafer for only leaving the top layer bonded to the substrate via the oxide layer, thus forming the structure, and heat treating this structure for reinforcing the bonding.

Different techniques have been developed nowadays to reduce the wafer, such as the well known processes called SMART-CUT® (whose general description is fully explained in the publication SILICON-ON-INSULATOR TECHNOLOGY: Materials to VLSI, $2^{nd}$ Edition (Jean-Pierre COLINGE) or BESOI (Bond Etch Silicon On Insulator).

The structure finally obtained from this process comprises the top layer on the oxide layer on the substrate. The top layer might be made of sapphire, Si <111>, SiC or any other semiconductor material that insures the quality of a growth of a useful layer thereon, e.g. made of a material for high frequency components like GaN. Additionally, the substrate is chosen for having high heat dissipation properties—i.e. a high thermal conductivity—in order to dissipate the heat produced by the components.

Since the crystal quality of the useful layer during growth on the composite structure is insuring by the top layer, it is not necessary providing the substrate with a high crystal quality. It is for example possible providing a substrate made of a polycrystalline material, like polycrystalline SiC ("polySiC"). These kinds of composite structures are therefore less costly than those of single-crystal SiC while still being a good substrate for the growth of a subsequent useful layer and still having good heat dissipation properties.

Even so, certain designed components still require better heat dissipation. Thus, there is a need for such heat dissipating structures and these are now provided by the present invention

SUMMARY OF THE INVENTION

The present invention now provides structures that have enhanced heat dissipation properties while still can be fabricating at relatively low cost. These structures are provided, according to a first aspect, by a method for fabricating a composite structure having high heat dissipation properties, wherein the structure comprises a support substrate, a top layer and an oxide layer between the support substrate and the top layer. The method comprises the steps of:

providing a top layer made of a crystalline material, providing a support substrate of a polycrystalline material having heat dissipation properties greater than that of a bulk single crystal silicon substrate of the same dimensions;

providing an oxide layer on at least one of the top layer or the support substrate;

bonding the top layer and support substrate together to obtain a composite structure having the top layer, the support substrate and the oxide layer located at a bonding interface between the top layer and support substrate, and heat treating the composite structure in a non-oxidizing atmosphere at a predetermined temperature and for a predetermined duration to dissolve at least part of the oxide layer and increase the heat dissipation properties of the composite structure compared to the composite structure prior to the heat treating.

Other optional characteristics of the method include:

the oxide layer is formed on the substrate, the top layer, or both prior to contacting the top layer with the substrate such that the oxide layer is located at the bonding interface; and the top layer is provided by providing a donor substrate that includes the top layer.

The method further comprises, after the bonding and prior to the heat treatment, a reduction of the thickness of the donor substrate for only keeping the top layer bonded to the support substrate. Prior to conducting the method, atomic species may be implanted into the donor substrate for forming a zone of weakness beneath the top layer, and the reduction of the donor substrate comprises supplying energy for detaching the top layer from the donor at the zone of weakness. The thickness of the support substrate may be reduced before bonding by the application of a heat treatment, a chemical treatment or mechanical forces (CMP, etc.).

A preferred temperature for the heat treating is between 1100° C. and 1300° C., preferably between 1200° C. and 1300° C., for a preferred duration of about two hours.

Regarding dimensions, the oxide layer after bonding has a thickness between 10 nm and 1000 nm, and more particularly between 25 nm and 50 nm, while the top layer after transfer has a thickness between 25 nm and 1000 nm, preferably around 100 nm.

A preferred substrate material is polycrystalline silicon carbide.

The heat treatment is conducted under non-oxidizing atmosphere, i.e., an inert or reducing atmosphere, and preferably a hydrogen or argon atmosphere.

According to another aspect, the invention proposes a structure having high heat dissipation properties, that has a top layer made of a crystalline material, and a support substrate made of a polycrystalline material having a thermal conductivity greater than those of a single crystal silicon substrate having the same dimensions.

Optional characteristics of this structure are as follows:

the support substrate and the top layer are preferably in direct contact;

the support substrate is silicon carbide;

the top layer is a single crystal silicon <111> or SiC; and the top layer, the supporting substrate, or both comprises an oxide layer which is located between the top layer and support substrate, wherein the oxide layer is reduced in thickness compared to conventional composite structures in order to increase the heat dissipation properties of the structure.

According to a yet another aspect, the invention proposes the use of the composite structure as a substrate for the crystal growth of at least one layer made of a material for high-frequency applications.

BRIEF DESCRIPTION OF THE DRAWING FIGURES

Other characteristics, features and advantages of the invention will appear clearer in the description below, which is illustrated by the following figures.

DETAILED DESCRIPTION OF THE PREFERRED EMBODIMENTS

Figure 1:
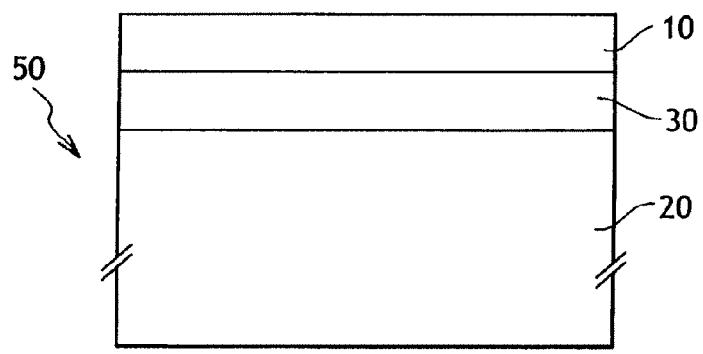
FIG. 1 shows a schematic cross-section view of structure according to the prior art.

Referring to FIG. 1, a structure 50 from which the treatment according to the invention will be processed, is shown. The structure 50 is a composite structure arranged for being highly heat dissipative, i.e. it is able to dissipate more heat than a bulk single crystal structure having the same dimensions. This structure 50 comprises a support substrate 20, an oxide layer 30 and a semiconductor top layer 10.

The support substrate 20 stiffens the whole structure 50. To this aim, it has a sufficient thickness, typically of hundreds of micrometers. The support substrate 20 is made of a material having good heat dissipation properties, i.e. it is able to dissipate more heat than a bulk single crystal substrate having the same dimensions. This material is further made of a low cost material, like a material with low crystalline quality. It can be formed of a polycrystalline SiC, polycrystalline Diamond, or other, or of at least two of these materials stacked one onto the other.

The top layer 10 is of at least one crystalline material. The top layer 10 may be of SiC, Si<111>, or another crystalline material. An advantage of the Si <111> material is that match with GaN lattice and then could be used for future GaN growth. The top layer 10 may alternatively be of a combination or a superposition of at least two of these materials and/or a superposition of several sub-layers.

The top layer 10 is preferably adapted for receiving electronic or optoelectronic components or for being a substrate for the subsequent growth of a useful layer, like a useful layer for high-frequency applications. According to the invention, the top layer 10 is advantageously thin. Its thickness is advantageously less than about 1000 nm. For example, the top layer 10 may have a thickness between around 25 nm and 1000 nm, preferably around 100 nm.

The insulating layer 30 is an oxide layer, buried in the structure 50, located between the support substrate 20 and the top layer 10. The oxide layer 30 is of an oxide of the crystalline material of the top layer 10 and/or of the top part of the support substrate 20.

For example, if the top layer 10 is of silicon, the oxide layer 30 is of $SiO_2$. Its thickness may be between less than 50 nm, and more particularly between around 10 nm and 100 nm.

Figure 2A:
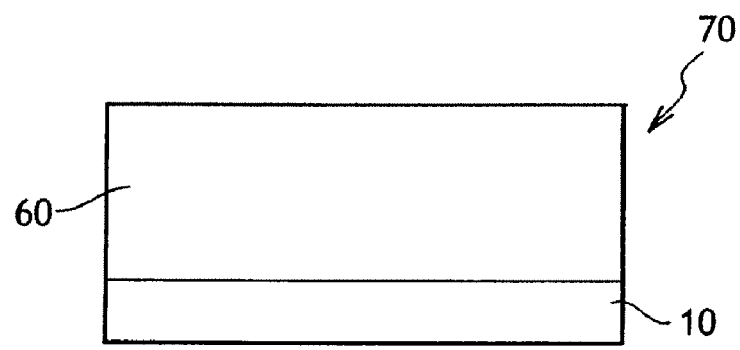
FIGS. 2A to 2C show the different steps of a process of manufacturing the structure.
Figure 2B:
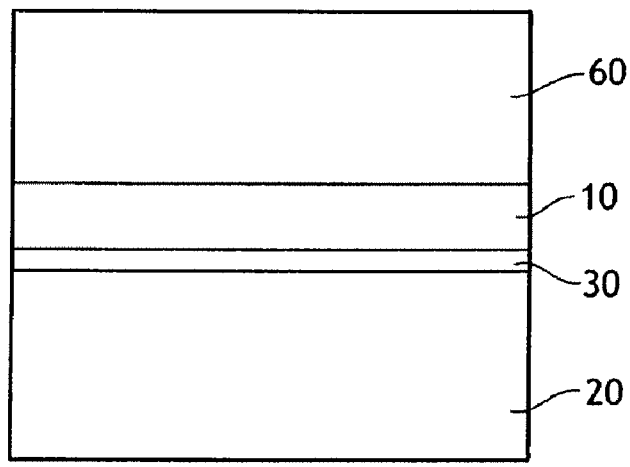
Figure 2C:
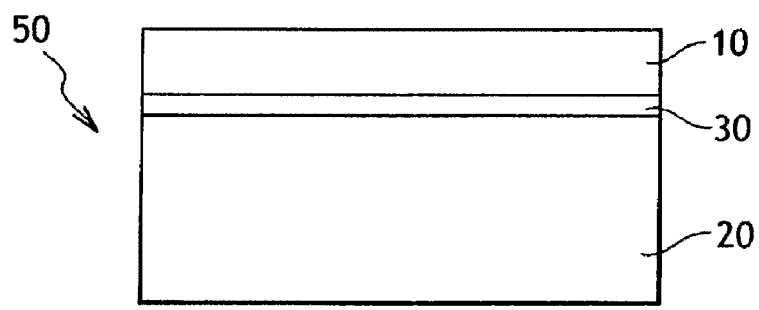

Referring now to FIGS. 2A-2C, the manufacturing of this structure 50 can be done by a wafer bonding technique. Especially, referring to FIG. 2A, the manufacturing can be firstly implemented by providing a wafer 70 with the top layer 10 therein, the top layer 10 lying at the surface of the wafer 70 defining a front layer on a rear portion 60 of the wafer 70.

A second step consists of bonding the wafer 70 to the support substrate 20 such that the top layer 10 is adjacent to the bonding interface. Advantageously, the bonding is firstly implemented by well-known bonding techniques (see, for example, "Semiconductor Wafer Bonding Science and Technology" by Q.-Y. Tong and U. Gösele—a Wiley Interscience publication, Johnson Wiley & Sons, Inc—for more details). Thus, for example, molecular bonding of hydrophilic surfaces or surfaces rendered hydrophilic may be done.

Well-known cleaning steps may be implemented just before bonding, if desired. Optionally, a plasma treatment of one and/or the other of the two surfaces to be bonded, followed by conventional annealing or RTA treatment (rapid thermal annealing), may be and preferably is implemented.

Before bonding, the oxide layer 30 was formed on the top layer 10 and/or on the substrate 20, for being buried at the bonding interface after bonding. The oxide layer 30 may be formed by oxidation of the top layer 10 and/or of the substrate 20. For example, if the top layer 10 is of Si (111) or SiGe (111), $SiO_2$ layer 30 may be formed at the surface by deposition or thermal oxidation. Alternatively, the oxide layer 30 may be formed by deposition of aggregates constituted of the oxide material. For example, $SiO_2$ aggregates may be deposited. Alternatively, both surfaces of the top layer 10 and the substrate 20 may also have oxide layer formed thereon either by deposition or by oxidation. The parameters of the formation of the oxide are controlled such that the oxide layer 30 has a predetermined thickness for being a thermal barrier between the top layer 10 and the substrate 20.

Referring to FIG. 2B, the substrate 20 and the wafer 70 are bonded together such that the oxide layer 30 is located at their interface, as previously explained. Optionally, at least one step of heating is additionally implemented for reinforcing the bonds at the interface.

Referring to FIG. 2C, the wafer 70 is then reduced such that the whole rear portion 60 is removed. Only the top layer 10 is kept. Any technique of wafer reduction may be used, such as chemical etching technique, lapping then polishing, the SMART-CUT® process which is known per se to the skilled person (see for example <<Silicon-On-Insulator Technology: Materials to VLSI, 2nd Edition>> from Jean-Pierre Colinge in <<Kluwer Academic Publishers>>, p. 50 et 51), taken alone or in combination. In particular, if using the SMART- CUT® process, the wafer 70 is implanted prior to bonding, with atomic species (such as hydrogen, helium or a combination of the two, and/or other atomic species) at energy and dose selected to form therein a zone of weakness at a depth close to the thickness of the top layer 10. The implantation may be carried out before or after forming the thin oxide layer 30. Finally, once the bonding has been carried out, the SMART-CUT® process comprises supplying suitable energy (such as thermal or mechanical energy) for rupturing the bonds at the zone of weakness, and thus detaching the rear portion 60 from the top layer 10.

An optional step of finishing (by polishing, CMP, cleaning, RTA . . . ) may be implemented after the reduction step, in order to have a smooth and homogeneous top layer 10 but also to cure potential defects due to the implantation step. Other steps may also be provided, with no limitation according to the invention. The obtained structure 50 comprises successively the top layer 10, the oxide layer 30 and the support substrate 20.

A heat treatment is then implemented in an inert or reducing atmosphere, such as argon or hydrogen atmosphere or a mixture of them. The heat treatment is processed such that the oxide layer 30 reduces in thickness, by oxygen diffusion through the top layer 10. The temperature and the duration of the heat treatment are then chosen for inciting an amount of oxygen of the oxide layer 30 to diffuse through the top layer 10 rather than in the bulk substrate 20.

Additionally, the thickness of the top layer 10 may also have been chosen, when forming it, for inciting the diffusion. Indeed, the thinner the top layer 10, the faster the diffusion. This diffusion may also be accelerated by the fact that the atmosphere is chosen inert, as it can be deduced from the boundary conditions. In particular, the following reaction occurs at the surface of the semiconductor layer 10 if the inert atmosphere contains argon and the top layer 10 is of silicon:

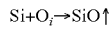

$Si + O_i \rightarrow SiO\uparrow$

For increasing the efficiency of this diffusion, a previous deoxidation of the surface of the semiconductor layer 10 may be performed. But the main parameters affecting the time of diffusion is the anneal temperature and the thickness of the top semiconductor layer 10. For example, the minimum annealing conditions to dissolve 2 nm of interfacial $SiO_2$, with 100 nm of top Si <111> layer 10, in a Ar or $H_2$ atmosphere, are:

1,100° C. for 2 hr, or 1,200° C. for 10 min, or 1,250° C. for 4 min.

The temperature and the duration of the heat treatment are then chosen for inciting an amount of oxygen of the oxide layer 30 to diffuse through the top layer 10. Then, the thickness of the oxide layer 30 decreases by a predetermined value. Additionally, the thickness of the top layer 10 may also have been chosen, when forming it, for inciting the diffusion.

Particularly, the thickness of the top layer 10 and the temperature of the heat treatment determine the mean reduction rate of the oxide layer 30. More the thickness less the rate. More the temperature more the rate. For example, the thickness and temperature may be predetermined such that at least about 0.5 angstroms per minute of oxide layer 30 mean reduction rate is reached. To this purpose, for a temperature of about 1200° C., a thickness of a Si single crystal layer 10 is chosen less than 2500 angstroms. Only the duration of the heat treatment is then necessary to control for accurately reducing the thickness of the oxide layer 30 by a predetermined value.

Alternatively, the thickness of the top layer 10 has been chosen for reducing the oxide layer 30 by a predetermined value by implementing the heat treatment with a predetermined duration and a predetermined temperature. The predetermined temperature may be chosen about 1000° C. to 1300° C., and especially around 1200° C. to 1300° C. inclusive. The thickness of the top layer 10 is preferably between around 25 and around 1000 nanometers, the predetermined temperature is about 1200° C. and the predetermined duration is between around 5 minutes and 5 hours.

The heat treatment may be processed for removing the whole oxide layer 30 or a part of it. The final structure 50 after this heat treatment does not comprise any oxide layer 20 or comprises a much thinner oxide layer 20 between the top layer 10 and the substrate 20. Due to the low heat dissipation of an oxide material, the heat dissipation of the whole structure 50 is improved after having removed at least a part or all of the oxide layer 30.

Another advantage of the diffusion of oxygen under hydrogen atmosphere is the diffusion of contaminated particles, like boron atoms, trapped at the bonding interface. Indeed, the heat treatment under hydrogen atmosphere may lead to the diffusion of boron atoms through the top layer 10 and their evaporation at the surface of the top layer 10.

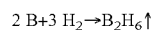

$2 B + 3 H_2 \rightarrow B_2H_6\uparrow$

As the boron decreases the resistivity of the HR Silicon, the final structure 50 may have an interface of better quality, with improved electrical properties.

Furthermore, due to the poor crystalline quality of the polycrystalline material of the support substrate 20 and to its thermal conductivity, the final temperature of the heat treatment can be reached with rapid ramps for temperature increase (or decrease) without leading to slip lines formation with a final temperature that could be up to 1300° C. The manufacturing costs are consequently reduced, thanks to the decrease of the time of manufacturing and to the choice of the bulk substrate, while the heat dissipation properties of the final structure 50 are increased.

Finally, the silicon HR (for "High Resistivity") is not necessary. There could also be applications requiring electrical conductance at the substrates and therefore inducing the use of other materials.

Figure 3:
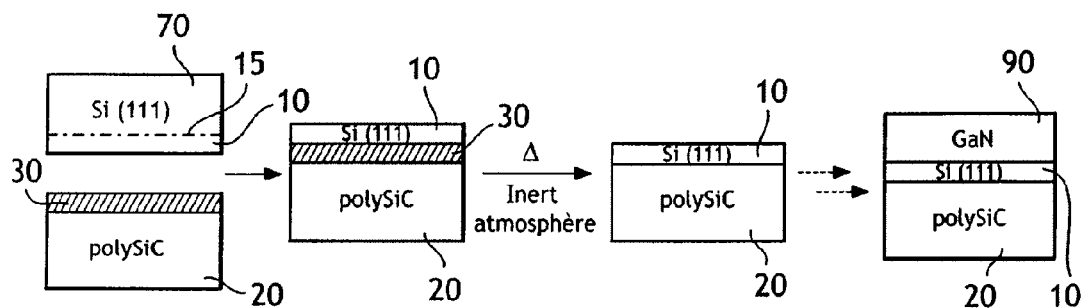
FIG. 3 shows steps of a process of manufacturing an example of structure.

Referring to FIG. 3, a polySiC substrate 20 is bonded to a Si (111) wafer 70. The oxide layer 30 is formed on the silicon wafer 70 and/or on the polySiC substrate 20. The oxide layer 30 on the wafer 70 is formed thermally or by deposition, while the oxide layer 30 on the polySiC is formed by deposition by PECVD (Plasma-Enhanced Chemical Vapor Deposition) or LPCVD (Low Pressure Chemical Vapor Deposition). The thickness of the global oxide layer, which is here $SiO_2$, is between around 25 nm and around 50 nm.

The SMART-CUT® process is conducted for implantation of the donor substrate 20 prior to the bonding leads to the formation of a zone of weakness 15. Then, the transfer of a thin Si (111) layer 10 to the substrate 20 is obtained after application of mechanical forces and/or by heating in order to break the mechanical bonds at the zone of weakness 15.

As polySiC may be rough for bonding, the LPCVD oxide 30 is preferably polished to reduce such roughness before being bonded to the Si (111) wafer 70. The bonding is obtained by molecular bonding and the interface is reinforced by a thermal treatment. This thermal treatment is also used for dissolving the insulating layer 30 by diffusion of oxygen. This thermal treatment is realized at a temperature comprised between 1150° C. and 1250° C., more precisely 1200° C., for around five minutes to five hours (preferably, for 2 hours), under an atmosphere comprising hydrogen or argon, or a mixture of both. As a result, the oxide layer 30 is entirely dissolved.

What is claimed is:

1. A method for fabricating a composite structure having increased heat dissipation properties, which comprises:
   providing a top layer of a crystalline material,
   providing a support substrate of a polycrystalline material having heat dissipation properties greater than that of a bulk single crystal silicon substrate of the same dimensions;
   providing an oxide layer on at least one of the top layer or the support substrate;
   bonding the top layer and support substrate together to obtain a composite structure having the top layer, the support substrate and the oxide layer located at a bonding interface between the top layer and support substrate, and
   heat treating the composite structure in a non-oxidizing atmosphere at a predetermined temperature and for a predetermined duration to dissolve at least part of the oxide layer and increase the heat dissipation properties of the composite structure compared to the composite structure prior to the heat treating.

2. The method of claim 1, wherein the non-oxidizing atmosphere is an inert or reducing atmosphere.

3. The method of claim 1, wherein the oxide layer is formed on the support substrate prior to bonding.

4. The method of claim 1, wherein the oxide layer is formed on the top layer prior to bonding.

5. The method of claim 1, which further comprises providing the top layer from a donor substrate by reducing the donor substrate thickness after bonding it to the support substrate with the reduced thickness of the donor substrate constituting the top layer.

6. The method of claim 5, which further comprises forming a zone of weakness beneath the top layer of the donor substrate prior to bonding by implanting atomic species into the donor substrate and wherein the reducing of the donor substrate thickness comprises supplying energy to the bonded structure for detaching the top layer from the donor substrate at the zone of weakness.

7. The method of claim 1, wherein the predetermined temperature is between 1100° C. and 1300° C.

8. The method of claim 1, wherein the predetermined temperature is between 1200° C. and 1300° C.

9. The method of claim 7, wherein the predetermined duration is about two hours.

10. The method of claim 1, wherein the oxide layer after bonding has a thickness of between 10 nm and 1000 nm.

11. The method of claim 1, wherein the oxide layer after bonding has a thickness between 25 nm and 50 nm.

12. The method of claim 1, wherein the top layer has a thickness between 25 nm and 1000 nm.

13. The method of claim 1, wherein the substrate is a polycrystalline silicon carbide.

14. The method of claim 1, wherein the top layer is silicon carbide.

15. The method of claim 1, wherein the top layer is made of silicon <111>.

16. The method of claim 1, wherein the heat treating is conducted under a hydrogen atmosphere.

17. The method of claim 1, wherein the heat treating is conducted under an argon atmosphere.

18. The method of claim 1, which further comprises crystal growth of at least one layer made of a material for high-frequency applications upon the top layer.

* * * * *